United States Patent
Hsieh et al.

(10) Patent No.: US 12,424,551 B2
(45) Date of Patent: Sep. 23, 2025

(54) SEMICONDUCTOR STRUCTURE AND METHOD OF MANUFACTURING THE SAME

(71) Applicant: CHIPBOND TECHNOLOGY CORPORATION, Hsinchu (TW)

(72) Inventors: Chin-Tang Hsieh, Kaohsiung (TW); You-Ming Hsu, Kaohsiung (TW); Chun-Ting Kuo, Kaohsiung (TW); Lung-Hua Ho, Hsinchu (TW); Chih-Ming Kuo, Hsinchu County (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 535 days.

(21) Appl. No.: 17/972,648

(22) Filed: Oct. 25, 2022

(65) Prior Publication Data
US 2023/0170301 A1 Jun. 1, 2023

(30) Foreign Application Priority Data
Nov. 26, 2021 (TW) .................. 110144293

(51) Int. Cl.
*H01L 23/528* (2006.01)
*H01L 21/768* (2006.01)
*H01L 23/552* (2006.01)

(52) U.S. Cl.
CPC .... *H01L 23/5286* (2013.01); *H01L 21/76802* (2013.01); *H01L 21/76877* (2013.01); *H01L 23/552* (2013.01)

(58) Field of Classification Search
CPC ........... H01L 23/5286; H01L 21/76802; H01L 21/76877; H01L 21/76885; H01L 23/528; H01L 23/5283; H01L 23/5225
See application file for complete search history.

(56) References Cited

U.S. PATENT DOCUMENTS 8,617,929 B2   12/2013   Barth et al.
10,971,483 B2 *   4/2021   Jeng ..................... H01L 21/4853
(Continued)

FOREIGN PATENT DOCUMENTS

CN   111785700 A   10/2020
EP   3462484 A1   4/2019
(Continued)

OTHER PUBLICATIONS

Japanese Notice of Allowance mailed Dec. 11, 2023 for Japanese Patent Application No. 2022-173354, 3 pages.
(Continued)

*Primary Examiner* — Bac H Au
(74) *Attorney, Agent, or Firm* — Demian K. Jackson; Jackson IPG PLLC

(57) ABSTRACT

A semiconductor structure includes a substrate, a dielectric layer, a connection layer and wire layers. The dielectric layer is disposed on a surface of the substrate and includes vias showing the surface. The connection layer is disposed on the dielectric layer, a first connection portion of the connection layer is located in the vias and connected to the surface, a second connection portion of the connection layer is connected to the dielectric layer. A first ground portion of the ground metal layer is connected to the first connection portion of the connection layer, and a second ground portion of the ground metal layer is connected to the second connection portion of the connection layer. Each of the wire layers is disposed on the second connection portion of the connection layer, and the second ground portion is located between the adjacent wire layers.

10 Claims, 8 Drawing Sheets

(56) References Cited

U.S. PATENT DOCUMENTS

| | | | | |
|---|---|---|---|---|
| 2004/0166659 A1* | 8/2004 | Lin | ................... | H01L 23/53295 |
| | | | | 257/E21.582 |
| 2016/0307852 A1* | 10/2016 | Shih | ........................ | H01L 24/05 |
| 2018/0151495 A1* | 5/2018 | Hsu | ........................ | H01L 24/14 |
| 2019/0131245 A1 | 5/2019 | Maxim et al. | | |
| 2020/0235091 A1 | 7/2020 | Kang et al. | | |
| 2020/0321288 A1* | 10/2020 | Huang | .................. | H01L 23/552 |

FOREIGN PATENT DOCUMENTS

| | | | |
|---|---|---|---|
| JP | 2007-134359 A | 5/2007 |
| JP | 2008-010646 A | 1/2008 |
| JP | 2010-074027 A | 4/2010 |
| JP | 2013-251520 A | 12/2013 |
| KR | 10-2021-0061186 A | 5/2021 |
| TW | 201917799 A | 5/2019 |
| WO | 2019/133015 A1 | 7/2019 |

OTHER PUBLICATIONS

Korean office action mailed Aug. 8, 2024 for Korean Patent Application No. 10-2022-0142401, 8 pages.
Taiwanese Office Action mailed Feb. 10, 2023 for Taiwanese Patent Application No. 110144293, 3 pages.

* cited by examiner

SEMICONDUCTOR STRUCTURE AND METHOD OF MANUFACTURING THE SAME

FIELD OF THE INVENTION

This invention relates to a semiconductor structure, and more particularly to a semiconductor structure having ground metal layer and a method of manufacturing the same.

BACKGROUND OF THE INVENTION

FIGS. 1 and 2 are cross-section view diagrams of a conventional semiconductor structure 200 in different perspectives. The semiconductor structure 200 includes a substrate 210, conductive pads 220, a first dielectric layer 230, a first connection layer 240, a first wire layer 250, a ground metal layer 260, a second dielectric layer 270, a second connection layer 280 and a second wire layer 290. The conductive pads 220 are located on a surface 211 of the substrate 210, the first dielectric layer 230 is disposed on the surface 211 of the substrate 210 and has vias 231, some of the vias 231 expose the conductive pads 220, and one or some of the vias 231 expose the surface 211 of the substrate 210. The first connection layer 240 is disposed in the vias 231, a first connection portion 241 of the first connection layer 240 is located in one of the vias 231 and connected to one of the conductive pads 220, a second connection portion 242 of the first connection layer 240 is located in one of the vias 231 and connected to the surface 211 of the substrate 210. The first wire layer 250 is connected to the first connection portion 241, and the ground metal layer 260 is connected to the second connection portion 242 and it is arranged in center of the semiconductor structure 200 for blocking electromagnetic interference. The ground metal layer 260 is a barrier to block current signal transmission between two conductive pads 220 so the second dielectric layer 270 is required to cover the ground metal layer 260 and allow the second connection layer 280 and the second wire layer 290 to be disposed on the second dielectric layer 270 and not contact the ground metal layer 260. Consequently, the semiconductor structure 200 is a 2P2M (2-poly 2-metal) structure manufactured through a complex process and having a larger size.

SUMMARY

One object of the present invention is to divide a ground metal layer into two parts and allow a wire layer to be able to run between the second metal layers, and additional dielectric layer used to cover the ground metal layer is not necessary so as to achieve 1P2M scheme.

A semiconductor structure of the present invention includes a substrate, a dielectric layer, a connection layer, a ground metal layer and wire layers. The dielectric layer is disposed on a surface of the substrate and includes vias showing the surface. The connection layer is disposed on the dielectric layer, a first connection portion of the connection layer is located in the vias and connected to the surface, a second connection portion of the connection layer is connected to the dielectric layer. The ground metal layer is disposed on the connection layer, a first ground portion of the ground metal layer is connected to the first connection portion of the connection layer, and a second ground portion of the ground metal layer is connected to the second connection portion of the connection layer. Each of the wire layers is disposed on the second connection portion of the connection layer, and the second ground portion is located between the adjacent wire layers.

A method of manufacturing a semiconductor structure includes the steps of: providing a substrate having a surface; forming a dielectric layer on the surface of the substrate, the dielectric layer includes vias showing the surface; forming a connection layer on the dielectric layer, a part of the connection layer is located in the vias and connected to the surface, a part of the connection layer is connected to the dielectric layer; forming a patterned photoresist on the connection layer, the patterned photoresist includes openings which expose the connection layer; forming a metal layer in the openings of the patterned photoresist, the metal layer is connected to the connection layer exposed by the openings, a part of the metal layer is located in the vias of the dielectric layer; removing the patterned photoresist to expose the connection layer covered by the patterned photoresist; and etching the connection layer using the metal layer as a mask, the etched connection layer includes a first connection portion and a second connection portion, the first connection portion is located in the vias and connected to the surface, the second connection portion is connected to the dielectric layer. The metal layer includes a ground metal layer and wire layers, a first ground portion of the ground metal layer is connected to the first connection portion of the connection layer, and a second ground portion of the ground metal layer is connected to the second connection portion of the connection layer. Each of the wire layers is disposed on the second connection portion of the connection layer, and the second ground portion is located between the adjacent wire layers.

In the present invention, the ground metal layer of the semiconductor structure is divided into the first ground portion and the second ground portion, thus the wire layers can be disposed on the dielectric layer directly to achieve 1P2M scheme with reduced manufacturing complexity and overall size. Additionally, the second ground portion also disposed on the dielectric layer can prevent mutual electromagnetic interference between the wire layers and improve electromagnetic shielding property of the semiconductor structure.

DETAILED DESCRIPTION OF THE INVENTION

Figure 1:
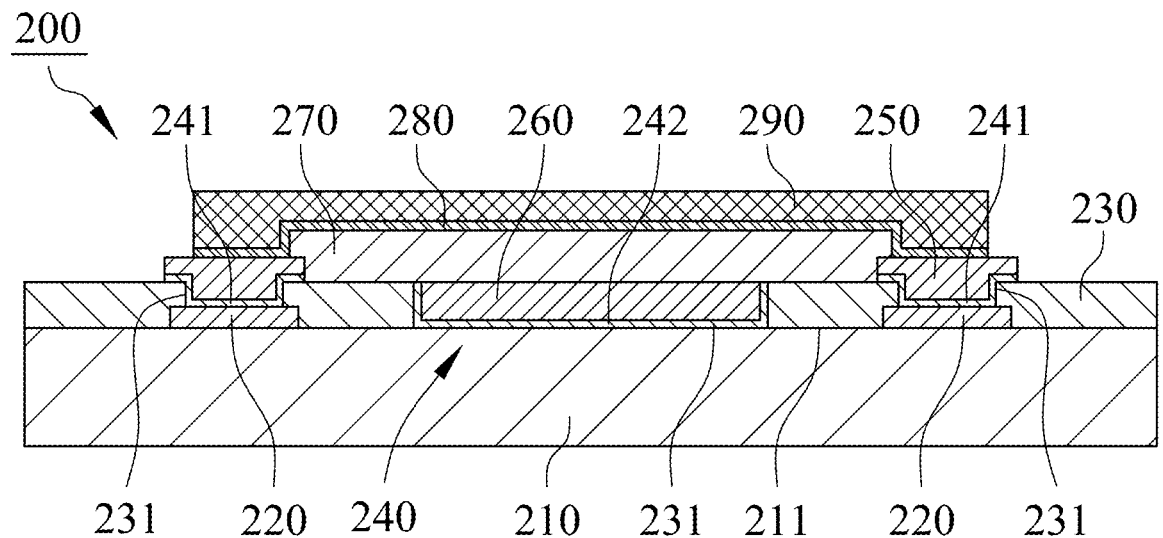
FIG. 1 is a cross-section view diagram illustrating a conventional semiconductor structure.
Figure 2:
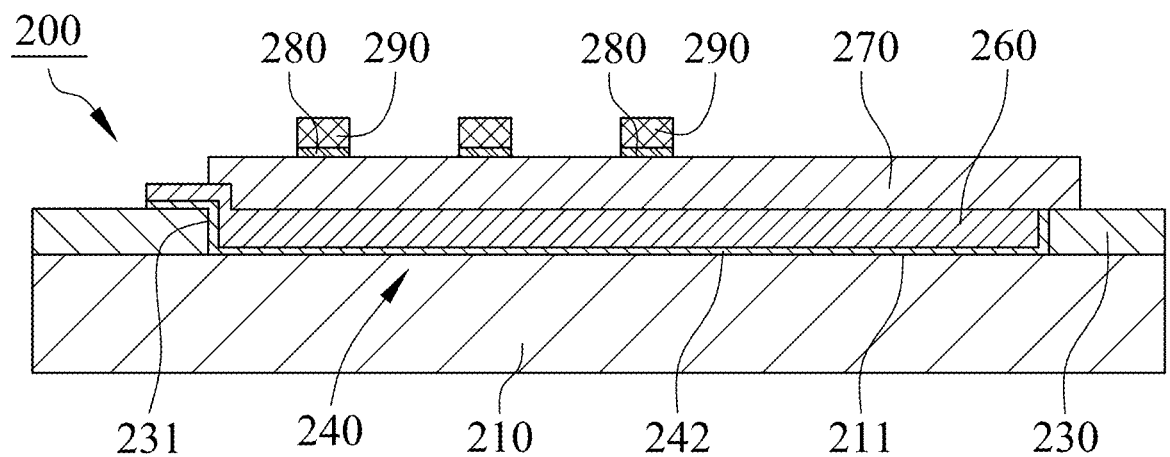
FIG. 2 is a cross-section view diagram illustrating the conventional semiconductor structure.
Figure 3:
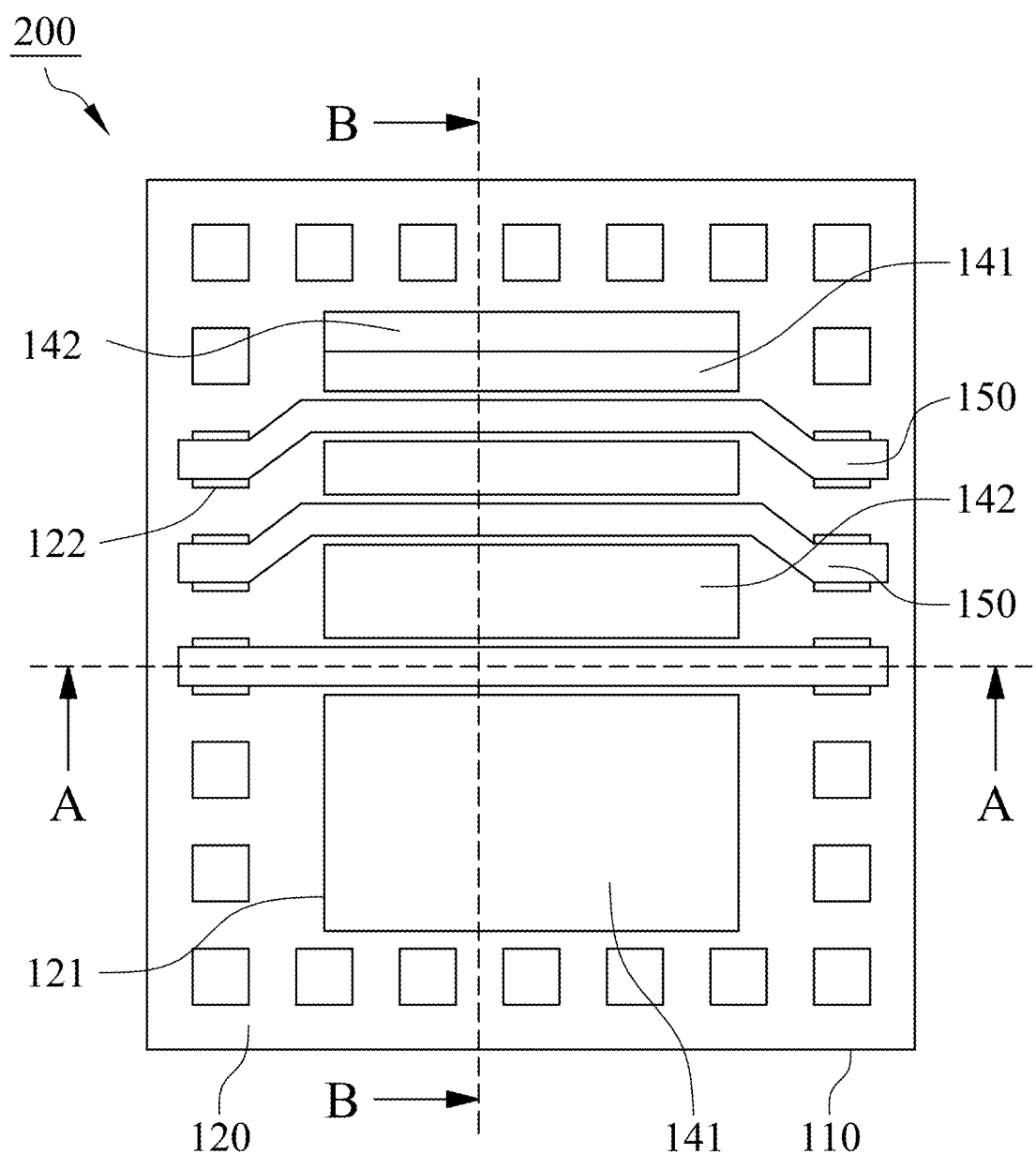
FIG. 3 is a top view diagram illustrating a semiconductor structure in accordance with one embodiment of the present invention.
Figure 4:
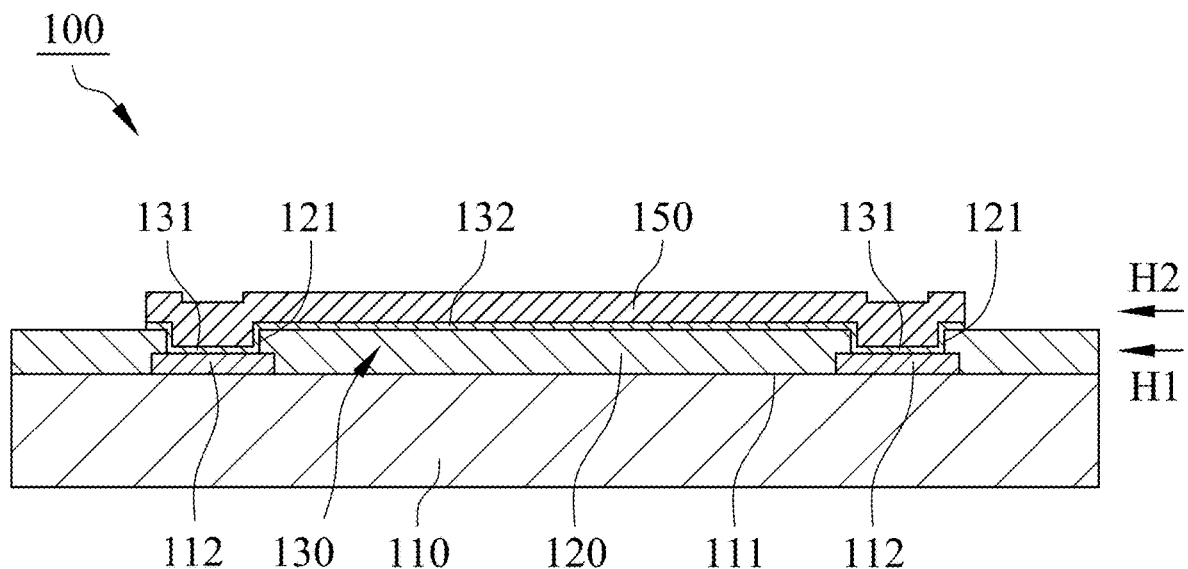
FIG. 4 is a cross-section view diagram along A-A line of FIG. 3.
Figure 5:
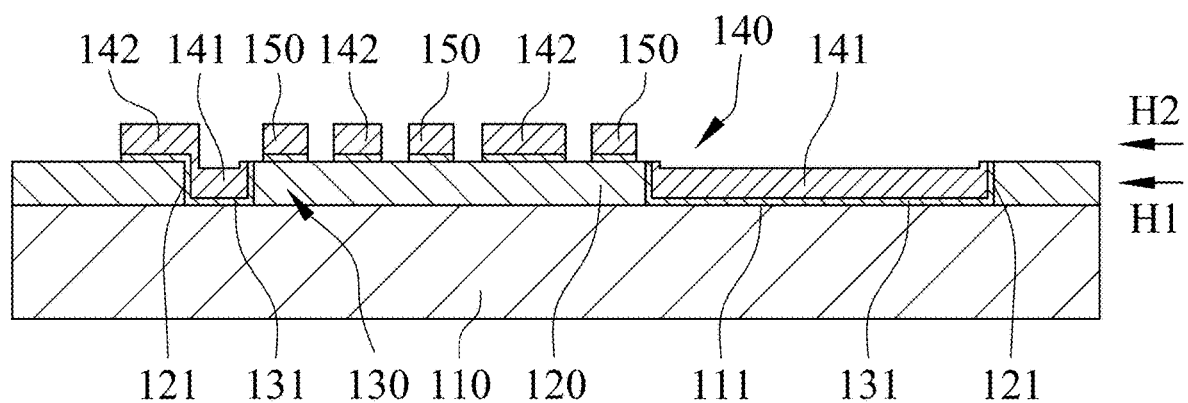
FIG. 5 is a cross-section view diagram along B-B line of FIG. 3.

A semiconductor structure 100 in accordance with one embodiment of the present invention is shown in FIGS. 3 to 5. FIG. 3 is a top view diagram of the semiconductor structure 100, FIG. 4 is a cross-section view diagram along A-A line of FIG. 3, FIG. 5 is a cross-section view diagram along B-B line of FIG. 3. In this embodiment, the semiconductor structure 100 includes a substrate 110, a dielectric layer 120, a connection layer 130, a ground metal layer 140 and a plurality of wire layers 150. The substrate 110 includes a plurality of conductive pads 112 which are disposed on a surface 111 of the substrate 110 and are input/output ends or ground ends of electronic components in the substrates 110.

With reference to FIGS. 4 and 5, the dielectric layer 120 is disposed on the surface 111 of the substrate 110 and includes a plurality of vias 121, each of the vias 121 exposes the surface 111 or one of the conductive pads 112. The dielectric layer 120, which may be made of BCB or polyimide, is used as a protective layer for the surface 111 of the substrate 110 or used as an isolation barrier between circuit elements.

The connection layer 130 is disposed on the dielectric layer 120 and includes a first connection portion 131 and a second connection portion 132, the first connection portion 131 is in the vias 121 and connected to the surface 111 of the substrate 110 or the conductive pads 112, the second connection portion 132 is located on and connected to the dielectric layer 120. The connection layer 130 may be a multiple layer including titanium-tungsten alloy layer and copper layer and used as an interlayer between a metal layer and the surface 111 of the substrate 110 or an interlayer between a metal layer and the dielectric layer 120.

The ground metal layer 140 is disposed on the connection layer 130 and includes a first ground portion 141 and a second ground portion 142, the first ground portion 141 is located in the via 121 of the dielectric layer 120 and connected to the first connection portion 131 of the connection layer 130, the second connection portion 142 is located on the dielectric layer 120 and connected to the second connection portion 132 of the connection layer 130. Preferably, the ground metal layer 140 is used as an electromagnetic shield owing to there is no current signal flow through the ground metal layer 140, and the first ground portion 141 is electrically connected to the second ground portion 142 via the connection layer 130 such that the first ground portion 141 and the second ground portion 142 are electrically connected as a conductive layer to have good electromagnetic shielding property. The ground metal layer 140 may be a copper layer or a multiple layer including a top copper layer, a middle nickel and a bottom copper layer.

The wire layers 150 are disposed on and connected to the second connection portion 132 of the connection layer 130, and both ends of each of the wire layers 150 are respectively extended into the vias 121 of the dielectric layer 120 to connect with the conductive pads 112 via the first connection portion 131 so that current signal transmission between the conductive pads 112 is available. The current signal transmitted by each of the wire layers 150 may generate electromagnetic wave in a radio frequency operation, for this reason, the second ground portion 142 is provided between the adjacent wire layers 150 in this embodiment to reduce electromagnetic interference (EMI) emission from the other wire layers 150. Each of the wire layers 150 may be a copper layer or a multiple layer including a top copper layer, a middle nickel and a bottom copper layer.

With reference to FIGS. 4 and 5, the dielectric layer 120, the first connection portion 131 and the first ground portion 141 are all located on a first horizontal height H1, and the second connection portion 132, the second ground portion 142 and the wire layers 150 are all located on a second horizontal height H2 which is higher than the first horizontal height H1. The second ground portion 142 located on the same level as the wire layers 150 can prevent electromagnetic wave generated by one of the wire layers 150 from interfering signal transmission in the other wire layers 150. Furthermore, the semiconductor structure 100 is a 1P2M structure with lower manufacturing complexity and smaller size because the wire layers 150 can be disposed on the dielectric layer 120 directly, another dielectric layer is not necessary.

Figure 6:
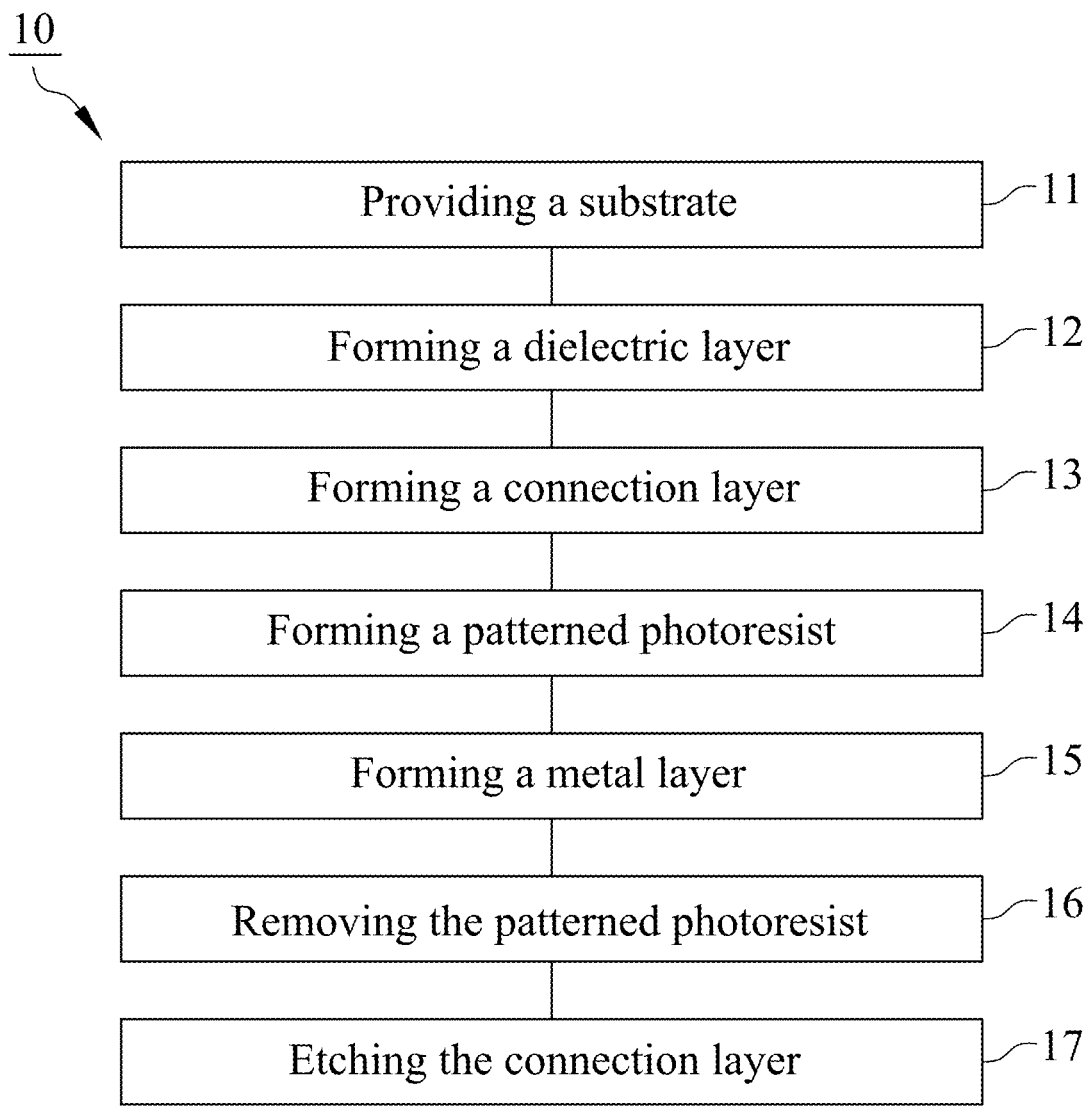
FIG. 6 is a flowchart of a method of manufacturing a semiconductor structure in accordance with one embodiment of the present invention.

FIG. 6 is a flowchart showing a method 10 of manufacturing the semiconductor structure 100, the method 10 includes a step 11 of providing a substrate, a step 12 of forming a dielectric layer, a step 13 of forming a connection layer, a step 14 of forming a patterned photoresist, a step 15 of forming a metal layer, a step 16 of removing the patterned photoresist and a step 17 of etching the connection layer.

Figure 7A:
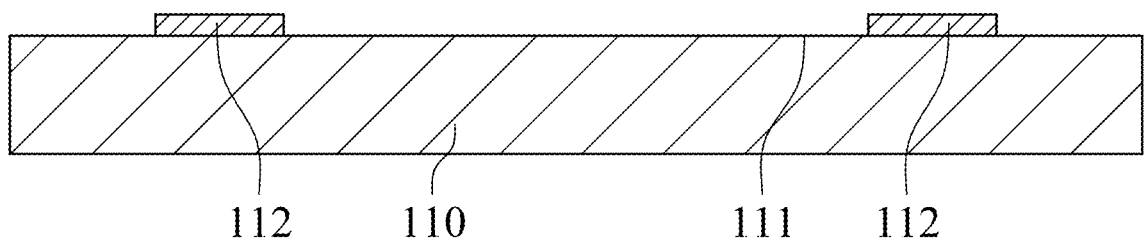
FIGS. 7A to 7G are cross-section view diagrams illustrating a method of manufacturing the semiconductor structure along A-A line of FIG. 3.
Figure 7B:
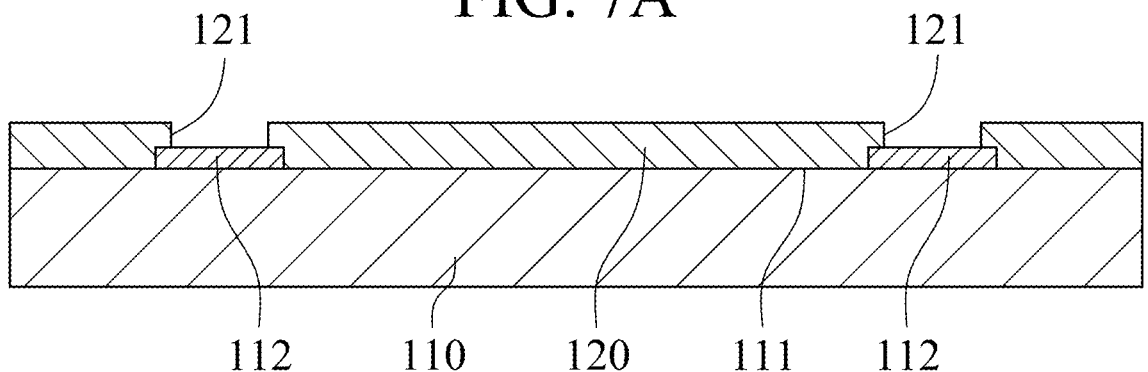
Figure 7C:
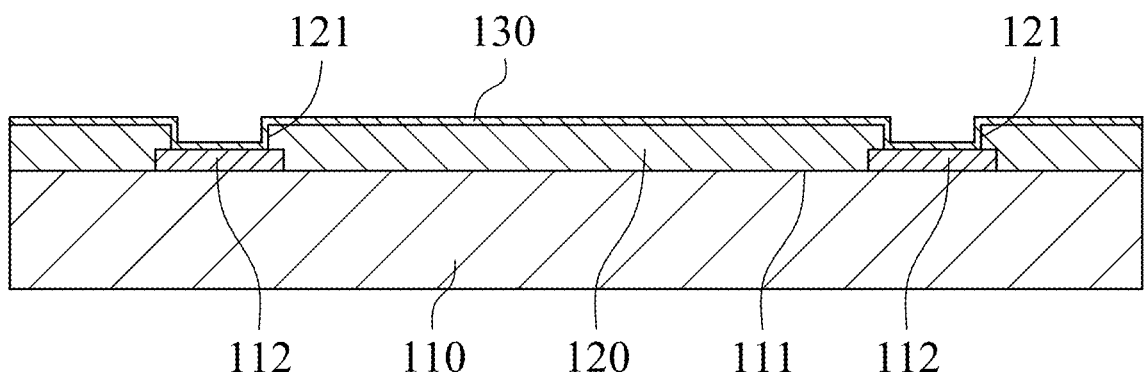
Figure 7D:
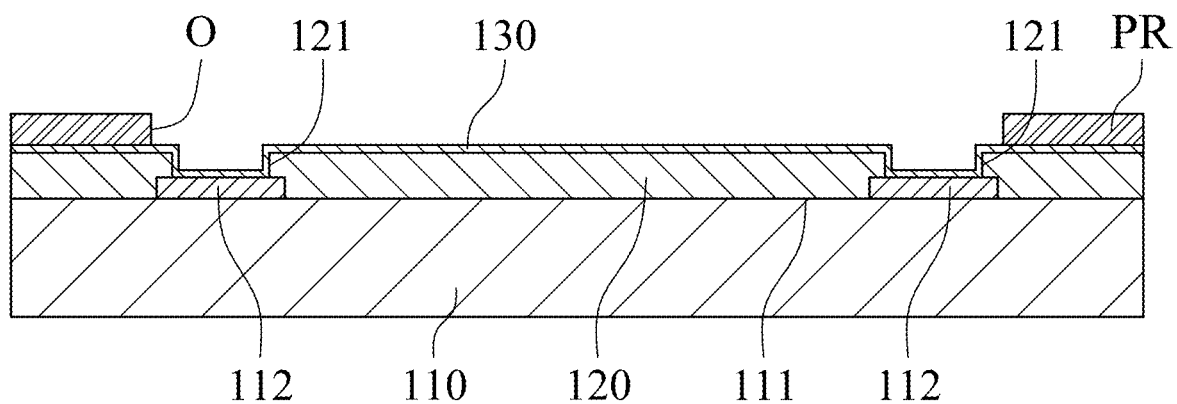
Figure 7E:
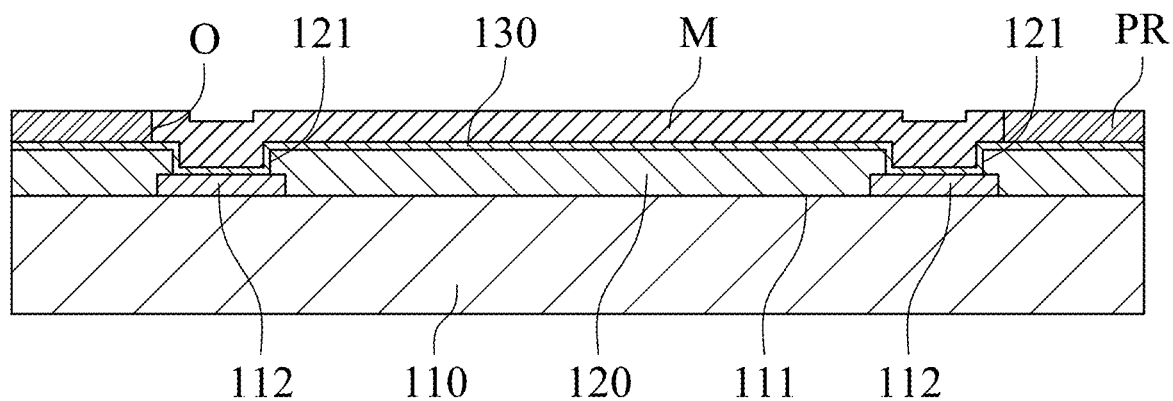
Figure 7F:
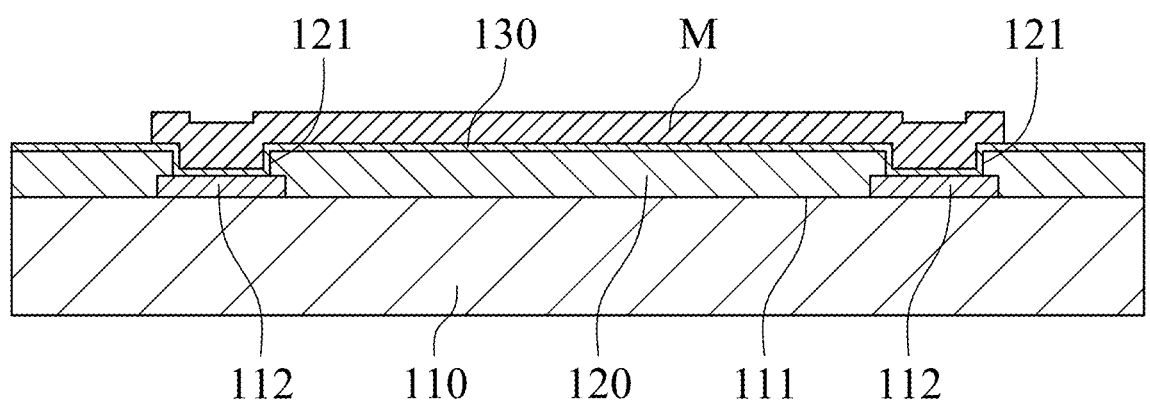
Figure 7G:
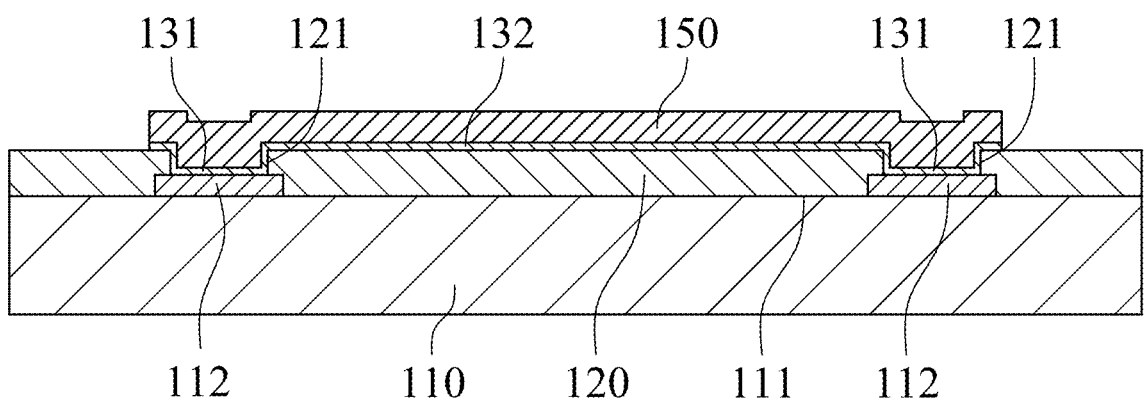
Figure 8A:
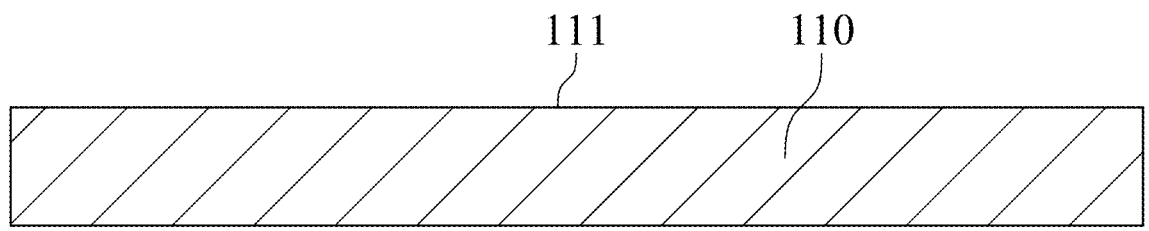
FIGS. 8A to 8G are cross-section view diagrams illustrating a method of manufacturing the semiconductor structure along B-B line of FIG. 3.

FIGS. 7A to 7G are cross-section view diagrams along A-A line of FIG. 3, and FIGS. 8A to 8G are cross-section view diagrams along B-B line of FIG. 3. With reference to FIGS. 6, 7A and 8A, a substrate 110 is provided in the step 11 and includes a plurality of conductive pads 112 located on a surface 111 of the substrate 110.

Figure 8B:
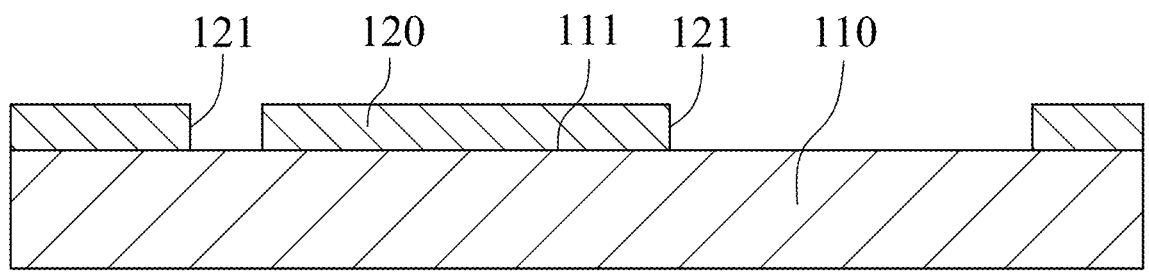

With reference to FIGS. 6, 7B and 8B, a dielectric layer 120 is formed on the surface 111 of the substrate 110 in the step 12. The dielectric layer 120 includes a plurality of vias 121, and each of the vias 121 exposes the surface 111 or one of the conductive pads 112 and can be formed on the dielectric layer 120 by photolithography.

Figure 8C:
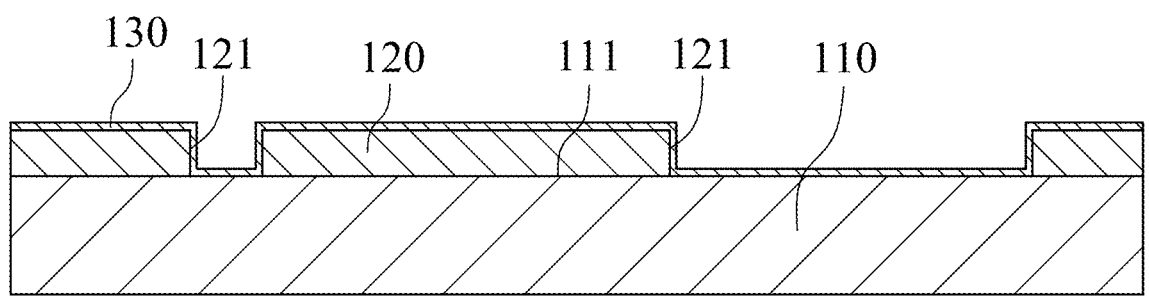

With reference to FIGS. 6, 7C and 8C, a connection layer 130 is formed on the dielectric layer 120 in the step 13, a part of the connection layer 130 is in the vias 121 to be connected to the surface 111 or the conductive pads 112, and a part of the connection layer 130 is connected to the dielectric layer 120. The connection layer 130 can be formed on the dielectric layer 120 through electroless plating or sputtering.

Figure 8D:
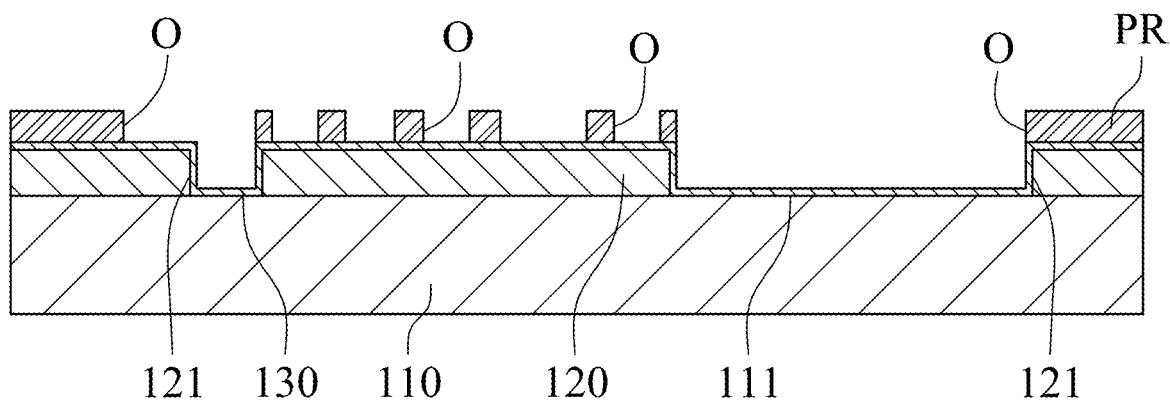

With reference to FIGS. 6, 7D and 8D, a patterned photoresist PR having a plurality of openings O is formed on the connection layer 130 in the step 14, the openings O show the connection layer 130 and are used to define the deposition area of the metal layer. The patterned photoresist PR is formed on the connection layer 130 after coating, exposure and development of a photoresist.

Figure 8E:
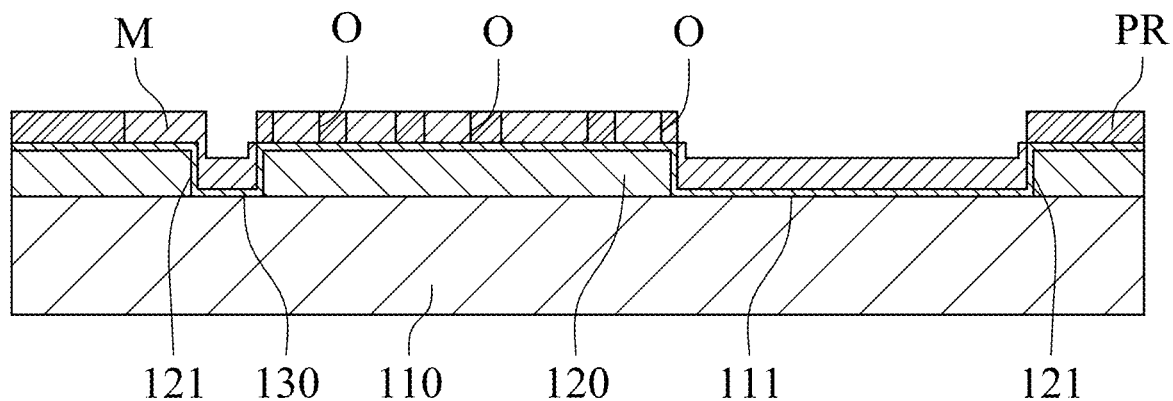

With reference to FIGS. 6, 7E and 8E, a metal layer M is formed in the openings O of the patterned photoresist PR in the step 15. The metal layer M is connected to the connection layer 130 visible through the openings O, and a part of the metal layer M is located in the via 121 of the dielectric layer 120. The metal layer M can be formed on the connection layer 130 by electroplating.

Figure 8F:
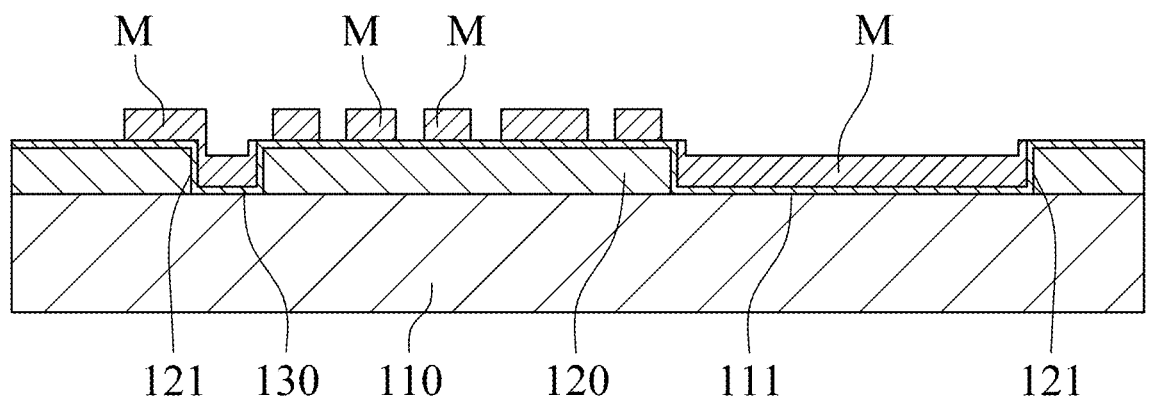
Figure 8G:
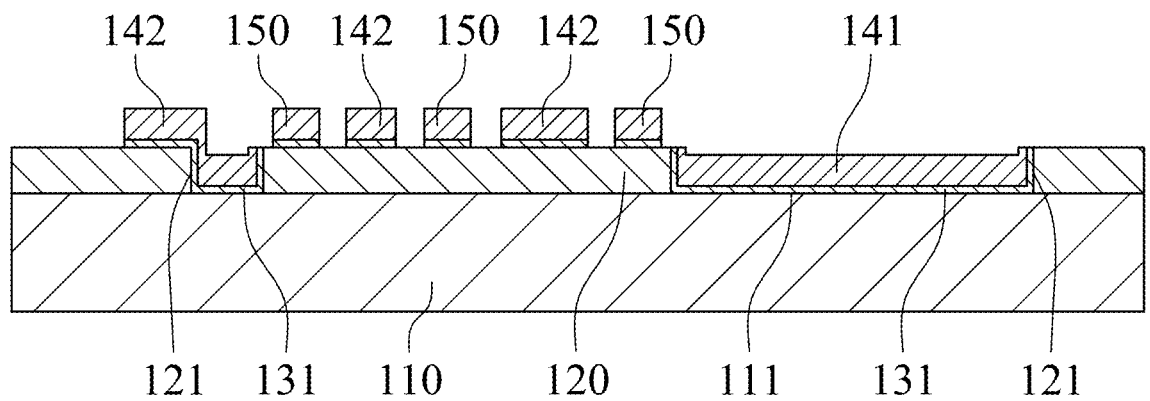

With reference to FIGS. 6, 7F and 8F, the patterned photoresist PR is removed to expose the connection layer 130 covered by the patterned photoresist PR in the step 16. With reference to FIGS. 6, 7G and 8G, the connection layer 130 is etched to include a first connection portion 131 and a second connection portion 132 using the metal layer M as a mask in the step 17. At last, a semiconductor structure 100 is obtained.

Owing to the ground metal layer 140 of the semiconductor structure 100 including the first ground portion 141 and the second ground portion 142, the wire layers 150 can be directly disposed on the dielectric layer 120 to become a 1P2M structure, and manufacturing complexity and size of the semiconductor structure 100 can be reduced. Furthermore, the second ground portion 142 is also disposed on the dielectric layer 120 so it can be used to protect the wire layers 150 from electromagnetic interference and enhance electromagnetic shielding ability of the semiconductor structure 100.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A semiconductor structure comprising:
a substrate including a surface;
a dielectric layer disposed on the surface and including a plurality of vias which expose the surface;
a connection layer disposed on the dielectric layer, a first connection portion of the connection layer is located in the plurality of vias and connected to the surface, a second connection portion of the connection layer is connected to the dielectric layer;
a ground metal layer disposed on the connection layer, a first ground portion of the ground metal layer is connected to the first connection portion of the connection layer, a second ground portion of the ground metal layer is connected to the second connection portion of the connection layer; and
a plurality of wire layers each disposed on the second connection portion of the connection layer, the second ground portion is located between the adjacent wire layers.

2. The semiconductor structure in accordance with claim 1, wherein the dielectric layer, the first connection portion and the first ground portion are located on a first horizontal height, the second connection portion, the second ground portion and the plurality of wire layers are located on a second horizontal height which is higher than the first horizontal height.

3. The semiconductor structure in accordance with claim 2, wherein the substrate includes a plurality of conductive pads which are disposed on the surface of the substrate, each of the plurality of conductive pads is exposed by one of the plurality of vias of the dielectric layer, the connection layer is connected to each of the plurality of conductive pads via one of the plurality of vias, and each of the plurality of wire layers is connected to each of the plurality of conductive pads by the connection layer.

4. The semiconductor structure in accordance with claim 2, wherein the first ground portion is connected to the second ground portion by the connection layer.

5. The semiconductor structure in accordance with claim 4, wherein there is no current signal passing through the ground metal layer.

6. A method of manufacturing a semiconductor structure comprising the steps of:
providing a substrate including a surface;
forming a dielectric layer on the surface of the substrate, the dielectric layer includes a plurality of vias which expose the surface;
forming a connection layer on the dielectric layer, a part of the connection layer is located in the plurality of vias of the dielectric layer and connected to the surface, a part of the connection layer is connected to the dielectric layer;
forming a patterned photoresist on the connection layer, the patterned photoresist includes a plurality of openings which expose the connection layer;
forming a metal layer in the plurality of openings of the patterned photoresist, the metal layer is connected to the connection layer which visible through the plurality of openings, and a part of the metal layer is located in one of the plurality of vias of the dielectric layer;
removing the patterned photoresist to expose the connection layer covered by the patterned photoresist; and
etching the connection layer using the metal layer as a mask, the etched connection layer includes a first connection portion and a second connection portion, the first connection portion is located in the plurality of vias and connected to the surface, the second connection portion is connected to the dielectric layer, wherein the metal layer includes a ground metal layer and a plurality of wire layers, a first ground portion of the ground metal layer is connected to the first connection portion of the connection layer, a second ground portion of the ground metal layer is connected to the second connection portion of the connection layer, each of the plurality of wire layers is disposed on the second connection portion of the connection layer, and the second ground portion is located between the adjacent wire layers.

7. The method in accordance with claim 6, wherein the dielectric layer, the first connection portion and the first ground portion are located on a first horizontal height, the second connection portion, the second ground portion and the plurality of wire layers are located on a second horizontal height which is higher than the first horizontal height.

8. The method in accordance with claim 7, wherein the substrate includes a plurality of conductive pads which are disposed on the surface of the substrate, each of the plurality of conductive pads is exposed by one of the plurality of vias of the dielectric layer, the connection layer is connected to each of the plurality of conductive pads via one of the plurality of vias, and each of the plurality of wire layers is connected to each of the plurality of conductive pads by the connection layer.

9. The method in accordance with claim 7, wherein the first ground portion is connected to the second ground portion by the connection layer.

10. The method in accordance with claim 9, wherein there is no current signal passing through the ground metal layer.

* * * * *